United States Patent
Narushima et al.

(10) Patent No.: US 9,536,745 B2
(45) Date of Patent: Jan. 3, 2017

(54) TUNGSTEN FILM FORMING METHOD

(71) Applicant: TOKYO ELECTRON LIMITED, Tokyo (JP)

(72) Inventors: Kensaku Narushima, Yamanashi (JP); Takanobu Hotta, Yamanashi (JP); Tomohisa Maruyama, Yamanashi (JP); Yasushi Aiba, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/011,339

(22) Filed: Jan. 29, 2016

(65) Prior Publication Data

US 2016/0233099 A1      Aug. 11, 2016

(30) Foreign Application Priority Data

Jan. 30, 2015  (JP) ................................ 2015-016774
Nov. 20, 2015  (JP) ................................ 2015-227740

(51) Int. Cl.
      *H01L 21/285*       (2006.01)
(52) U.S. Cl.
      CPC ... *H01L 21/28556* (2013.01); *H01L 21/28568* (2013.01)
(58) Field of Classification Search
      None
      See application file for complete search history.

(56) References Cited

U.S. PATENT DOCUMENTS

| | | | | |
|---|---|---|---|---|
| 8,673,778 | B2 * | 3/2014 | Satoh ................. | H01L 21/4814 257/E21.585 |
| 2005/0032364 | A1 | 2/2005 | Okubo et al. | |
| 2012/0244699 | A1 * | 9/2012 | Khandelwal ........ | C23C 16/0281 438/653 |
| 2015/0279732 | A1 * | 10/2015 | Lee ..................... | C23C 16/0281 438/675 |

FOREIGN PATENT DOCUMENTS

| | | |
|---|---|---|
| JP | 2003-193233 | 7/2003 |
| JP | 2004-273764 | 9/2004 |
| JP | 2006-28572 | 2/2006 |

* cited by examiner

*Primary Examiner* — Asok K Sarkar

(57) ABSTRACT

A tungsten film forming method for forming a tungsten film on a surface of a target substrate by an ALD (atomic layer deposition) method comprises adding a reduction gas to allow an ALD reaction to mainly occur when a tungsten chloride gas is supplied. In the ALD method, the tungsten chloride gas as a tungsten source gas and the reduction gas for reducing the tungsten chloride gas are alternately supplied into a chamber which accommodates the target substrate and is maintained under a depressurized atmosphere, with a purge process for purging an inside of the chamber performed between the supply of the tungsten chloride gas and the supply of the reduction gas.

18 Claims, 10 Drawing Sheets

TUNGSTEN FILM FORMING METHOD

CROSS-REFERENCE TO RELATED APPLICATIONS

This application claims priority to Japanese Patent Application No. 2015-016774 filed on Jan. 30, 2015 and Japanese Patent Application No. 2015-227740 filed on Nov. 20, 2015, the entire contents of which are incorporated herein by reference.

FIELD OF THE INVENTION

The disclosure relates to a tungsten film forming method.

BACKGROUND OF THE INVENTION

In manufacturing an LSI (large-scale integration), tungsten is widely used for a MOSFET gate electrode, a contact with a source/drain, a word line of a memory, or the like. In a multilayer interconnection process, a copper wiring is mainly used. However, copper is easily diffused and has insufficient heat resistance. Therefore, tungsten is used for a portion where heat resistance is required or a portion where electrical characteristics may deteriorate due to diffusion of copper.

A physical vapor deposition (PVD) method has been conventionally used for a tungsten film forming process. However, it is difficult in the PVD method to deal with a portion where a high step coverage is required. Therefore, a chemical vapor deposition (CVD) method that provides a good step coverage is used for film formation.

As a film forming method for forming a tungsten film (CVD-tungsten film) by using the CVD method, there is generally used a method in which reaction $WF_6 + 3H_2 \rightarrow W + 6HF$ occurs on a semiconductor wafer as a target object by using tungsten hexafluoride ($WF_6$) as a source gas and $H_2$ gas as a reduction gas (see, e.g., Japanese Patent Application Publication Nos. 2003-193233 and 2004-273764).

However, in the case of forming a CVD-tungsten film by using $WF_6$ gas, a gate insulating film is reduced by fluorine contained in $WF_6$ and electrical characteristics deteriorate at word lines of a memory or gate electrodes in a semiconductor device.

As a processing gas used for formation of a CVD-W film that does not contain fluorine, tungsten hexachloride ($WCl_6$) is known (see, e.g., Japanese Patent Application Publication No. 2006-28572, and J. A. M. Ammerlaan et al., "Chemical vapor deposition of tungsten by $H_2$ reduction of $WCl_6$", Applied Surface Science 53 (1991), pp. 24-29). Although both of chlorine and fluorine have reducibility, the reducibility of chlorine is weaker than that of fluorine. Further, it is desirable to decrease an adverse effect of chlorine on the electrical characteristics.

Along with the recent trend toward miniaturization of semiconductor devices, it is difficult to fill a pattern having a complicated shape even by using the CVD method that can provide a high step coverage. As a method capable of obtaining a higher step coverage, an atomic layer deposition (ALD) method, in which a source gas and a reduction gas are supplied sequentially with a purge process interposed therebetween, attracts attention.

However, in the case of forming a tungsten film by the ALD method using $WCl_6$ gas as a source gas and $H_2$ gas as a reduction gas, a deposited film thickness per one cycle is small. In other words, a film forming speed is low and, thus, a productivity is low.

SUMMARY OF THE INVENTION

In view of the above, the disclosure provides a method capable of forming a tungsten film having excellent fillability with a high productivity by an ALD method using $WCl_6$ gas as a source gas.

In accordance with an aspect of the disclosure, there is provided a tungsten film forming method for forming a tungsten film on a surface of a target substrate by an ALD (atomic layer deposition) method in which a tungsten chloride gas as a tungsten source gas and a reduction gas for reducing the tungsten chloride gas are alternately supplied into a chamber which accommodates the target substrate and is maintained under a depressurized atmosphere, with a purge process for purging an inside of the chamber performed between the supply of the tungsten chloride gas and the supply of the reduction gas, the method including adding the reduction gas to allow an ALD reaction to mainly occur when the tungsten chloride gas is supplied.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments will be described in detail with reference to the accompanying drawings.

Example of Film Forming Apparatus

Figure 1:
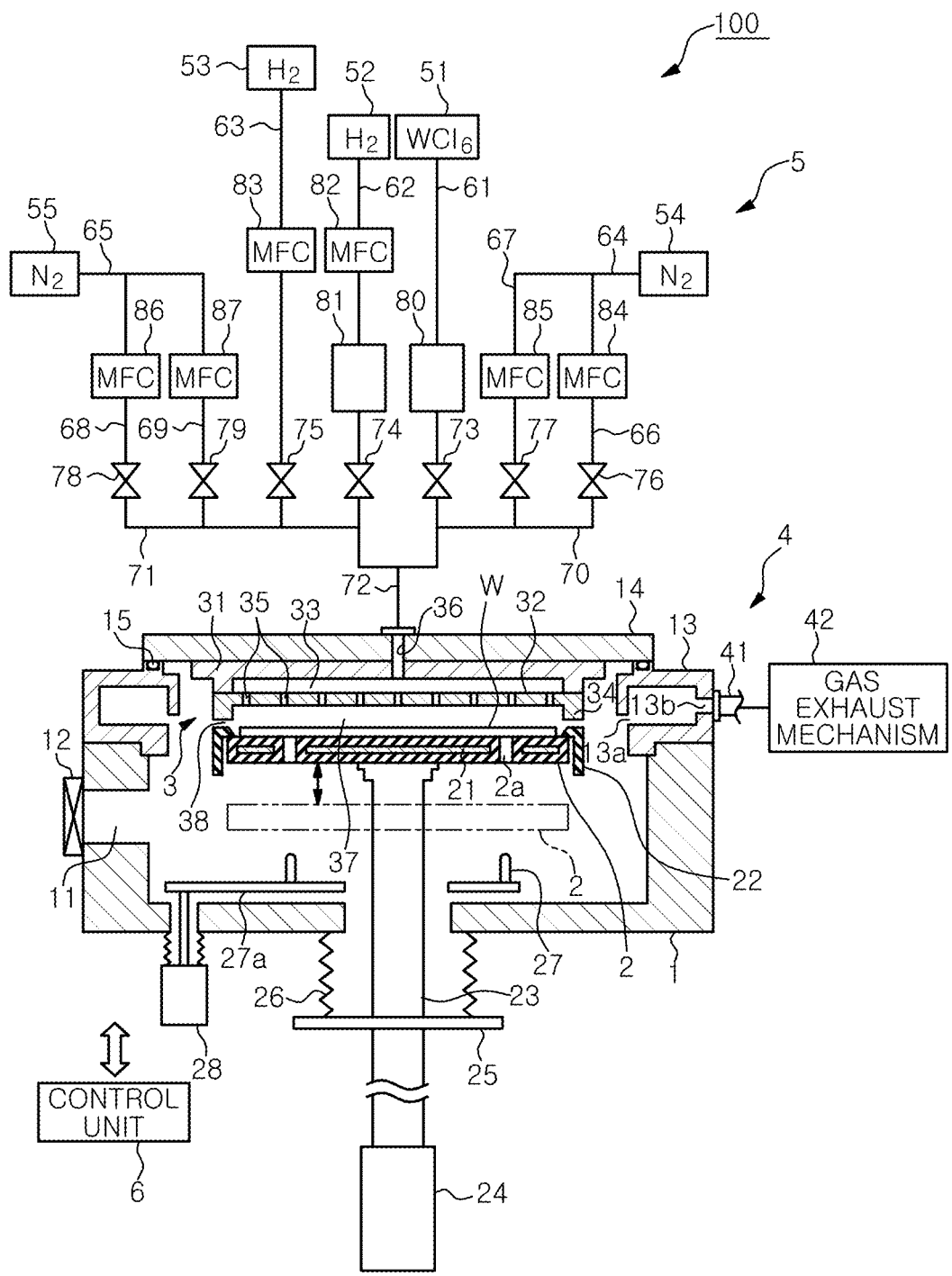
FIG. 1 is a cross sectional view showing an example of a film forming apparatus for performing a tungsten film forming method according to an embodiment.

FIG. 1 is a cross sectional view showing an example of a film forming apparatus for performing a tungsten film forming method according to an embodiment.

As shown in FIG. 1, a film forming apparatus 100 includes a chamber 1, a susceptor 2 for horizontally supporting a semiconductor wafer W (hereinafter, referred to as "wafer") that is a target substrate in the chamber 1, a shower head 3 for supplying a processing gas into the chamber 1 in a shower shape, a gas exhaust unit 4 for exhausting a gas from the chamber 1, a processing gas supply mechanism 5 for supplying a processing gas into the shower head 3, and a control unit 6.

The chamber 1 is made of a metal such as aluminum or the like and has a cylindrical shape. Formed at a sidewall of the chamber 1 is a loading/unloading port 11 through which the wafer W is loaded/unloaded. The loading/unloading port 12 can be opened and closed by a gate valve 12. A circular ring-shaped gas exhaust duct 13 having a rectangular cross section is formed on a main body of the chamber 1. The gas exhaust duct 13 has a slit 13a formed along an inner peripheral surface thereof. A gas exhaust port 13b is formed at an outer wall of the gas exhaust duct 13. A ceiling wall 14 is disposed on a top surface of the gas exhaust duct 13 to block an upper opening of the chamber 1. A space between the ceiling wall 14 and the gas exhaust duct 13 is airtightly sealed by a seal ring 15.

The susceptor 2 has a disc-shape of a size corresponding to the wafer W. The susceptor 2 is supported by a supporting member 23. The susceptor 2 is made of a ceramic material such as aluminum nitride (AlN) or the like, or a metal material such as aluminum, a Ni-based alloy or the like. A heater 21 for heating the wafer W is buried in the susceptor 23. The heater 21 is configured to generate heat by power supplied from a heater power supply (not shown). The wafer W can be controlled to a predetermined temperature by controlling an output of the heater 21 based on a temperature signal of a thermocouple (not shown) provided near a wafer mounting surface on the top surface of the susceptor 2.

The susceptor 2 has a covering member 22 made of ceramic such as alumina or the like. The covering member 22 covers an outer peripheral area of the wafer mounting surface and a side surface of the susceptor 2.

The supporting member 23 for supporting the susceptor 2 extends from a center of a bottom surface of the susceptor 2 to a portion below the chamber 1 while penetrating through an opening formed at a bottom wall of the chamber 1. A lower end of the supporting member 23 is connected to an elevating mechanism 24. The susceptor 2 can be vertically moved by the elevating mechanism 24 via the supporting member 23 between a processing position shown in FIG. 1 and a transfer position where the wafer can be transferred. The transfer position is disposed below the processing position and indicated by a dashed dotted line. A collar portion 25 is attached to the supporting member 23 at a portion below the chamber 1. A bellows 26 that is extended and contracted by the vertical movement of the susceptor 2 is provided between the bottom portion of the chamber 1 and the collar portion 25. The bellows 26 isolates an atmosphere in the chamber 1 from the exterior air.

Three wafer supporting pins 27 (only two are shown) are provided near the bottom surface of the chamber 1 and protrude upward from an elevating plate 27a. The wafer supporting pins 27 can be vertically moved along with the elevating plate 27a by an elevating mechanism 28 provided below the chamber 1. The wafer supporting pins 27 can be inserted into respective through-holes 2a formed in the susceptor 2 and protrude beyond the top surface of the susceptor 2 when the susceptor 2 is located at the transfer position. By vertically moving the wafer supporting pins 27, the wafer W can be transferred between a wafer transfer unit (not shown) and the susceptor 2.

The shower head 3 is made of a metal. The shower head 3 is disposed to face the susceptor 2 and has substantially the same diameter as that of the susceptor 2. The shower head 3 includes a main body 31 fixed to the ceiling wall 14 of the chamber 1 and a shower plate 32 connected to a bottom portion of the main body 31. A gas diffusion space 33 is formed between the main body 31 and the shower plate. A gas inlet opening 36 communicates with the gas diffusion space 33 while penetrating through a central portion of the ceiling wall 14 of the chamber 1 and the main body 31. An annular protrusion 34 protruding downward is formed at a peripheral portion of the shower plate 32. Gas injection openings 35 are formed in an flat surface of the shower plate 32 at the inner sides of the annular protrusion 34.

In a state where the susceptor 2 is located at the processing position, a processing space 37 is formed between the shower plate 32 and the susceptor 2. Further, the annular protrusion 34 becomes close to the top surface of the covering member 22 of the susceptor 2 to form an annular gap 38.

The gas exhaust unit 4 includes a gas exhaust line 41 which is connected to the gas exhaust port 13b of the gas exhaust duct 13, and a gas exhaust mechanism 42 which has a vacuum pump, a pressure control valve and the like and is connected to the gas exhaust line 41. During the processing, a gas in the chamber 1 reaches the gas exhaust duct 13 through a slit 13a and is supplied from the gas exhaust duct 13 through the gas exhaust line 41 by the exhaust mechanism 42 of the gas exhaust unit 4.

The processing gas supply mechanism 5 includes a $WCl_6$ gas supply source 51 for supplying a $WCl_6$ gas that is a tungsten chloride gas as a tungsten source, a first $H_2$ gas supply source 52 for supplying $H_2$ gas as a main reduction gas, a second $H_2$ gas supply source 53 for supplying $H_2$ gas as an additional reduction gas, and a first and a second $N_2$ gas supply source 54 and 55 for supplying $N_2$ gas as a purge gas. The processing gas supply mechanism 5 further includes a $WCl_6$ gas supply line 61 extended from the $WCl_6$ gas supply source 51, a first $H_2$ gas supply line 62 extended from the first $H_2$ gas supply source 52, a second $H_2$ gas supply line 63 extended from the second $H_2$ gas supply source 53, a first $N_2$ gas supply line 64 extended from the first $N_2$ gas supply source 54 and configured to supply $N_2$ gas to the $WCl_6$ gas supply line 61, and a second $N_2$ gas supply line 65 extended from the second $N_2$ gas supply source 55 and configured to supply $N_2$ gas to the first $H_2$ gas supply line 62.

The first $N_2$ gas supply line 64 is branched into a first continuous supply line 66 for continuously supplying $N_2$ gas during the film formation using the ALD method and a first flush purge line 67 for supplying $N_2$ gas only during the purge process. The second $N_2$ gas supply line 65 is branched into a second continuous supply line 68 for continuously supplying $N_2$ gas during the film formation using the ALD method, and a second flushpurge line 69 for supplying $N_2$ gas only during the purge process. The first continuous supply line 66 and the first flush purge line 67 are connected to a first connection line 70. The first connection line 70 is connected to the $WCl_6$ gas supply line 61. The second $H_2$ gas supply line 63, the second continuous supply line 68, and the second flush purge line 69 are connected to a second connection line 71. The second connection line 71 is connected to the first $H_2$ gas supply line 62. The $WCl_6$ gas supply line 61 and the first $H_2$ gas supply line 62 join with a joint line 72. The joint line 72 is connected to the gas inlet opening 36.

The $WCl_6$ gas supply line 61, the first $H_2$ gas supply line 62, the second $H_2$ gas supply line 63, the first continuous supply line 66, the first flush purge line 67, the second continuous supply line 68, and the second flush purge line 69 have opening/closing valves 73 to 79 for switching gases during the ALD, respectively. Further, mass flow controllers 82 to 87 serving as flow rate controllers are provided at upstream sides of the opening/closing valves of the first $H_2$ gas supply line 62, the second $H_2$ gas supply line 63, the first continuous supply line 66, the first flush purge line 67, the second continuous supply line 68, and the second flush purge line 69, respectively. The $WCl_6$ gas supply line 61 and the first $H_2$ gas supply line 62 have buffer tanks 80 and 81, respectively so that required gases can be supplied within a short period of time.

Figure 2:
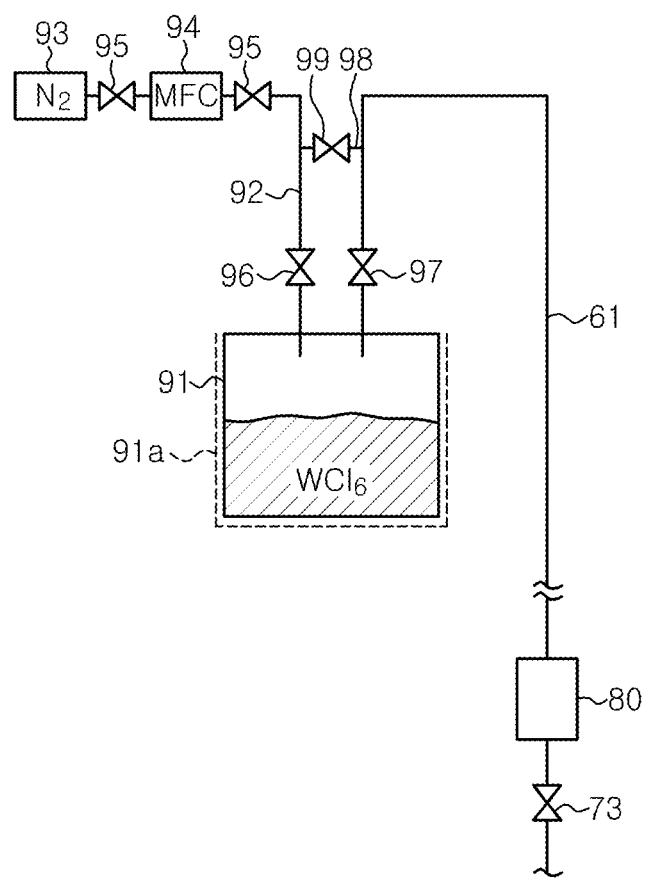
FIG. 2 shows a $WCl_6$ gas supply source of the film forming apparatus shown in FIG. 1.

As shown in FIG. 2, the $WCl_6$ gas supply source 51 includes a film forming material tank 91 for accommodating $WCl_6$. Since $WCl_6$ is in a solid state at a room temperature, solid $WCl_6$ is accommodated in the film forming material tank 91. A heater 91a is provided around the film forming material tank 91 to heat the film forming material in the tank 91 to an appropriate temperature to sublimate $WCl_6$.

A carrier gas line 92 for supplying $N_2$ gas as a carrier gas is inserted into the film forming material tank 91 from the top thereof. A carrier $N_2$ gas supply source 93 is connected to the carrier gas line 92. The carrier gas line 92 has a mass flow controller 94 serving as a flow rate controller and valves 95 disposed to sandwich the mass flow controller 94 therebetween. The $WCl_6$ gas supply line 61 is inserted into the film forming material tank 91 from the top thereof. A heater (not shown) for preventing condensation of $WCl_6$ gas that is a film forming material is provided in the $WCl_6$ gas supply line 61. $WCl_6$ gas sublimated in the film forming material tank 91 is transferred by the carrier $N_2$ gas to the $WCl_6$ gas supply line 61.

The carrier gas line 92 and the $WCl_6$ gas supply line 61 are connected by a bypass line 98. A valve 99 is installed in the bypass line 98. Valves 96 and 97 are installed at downstream side of the connection portion between the carrier gas line 92 and the line 98, and at upstream side of the connection portion between the line 98 and the $WCl_6$ gas supply line 61, respectively. By closing the valves 96 and 97 and opening the valve 99, $N_2$ gas from the carrier $N_2$ gas supply source 93 can purge the $WCl_6$ gas supply line 61 through the carrier gas line 92 and the bypass line 98.

The control unit 6 includes a process controller having a microprocessor (computer) for controlling the respective components, e.g., a valve, a power supply source, a heater, a pump and the like, a user interface, and a storage unit. The respective components of the film forming apparatus 100 are electrically connected to and controlled by the process controller. The user interfaces including a keyboard, a display and the like are connected to the process controller. The keyboard allows an operator to input commands for managing the respective components of the film forming apparatus 100. The display visually displays an operation state of the respective components of the film forming apparatus 100. The storage unit is also connected to the process controller. The storage unit stores a control program for executing various processes to be performed in the film forming apparatus 100 under the control of the process controller, a control program, i.e., a processing recipe, for executing predetermined processes of the respective components of the film forming apparatus 100 in accordance with processing conditions, various database, and the like. The processing recipe may be stored in a storage medium (not shown) of the storage unit. The storage medium may be a fixed one such as a hard disk or the like, or a portable one such as a CDROM, a DVD, a semiconductor memory or the like. Also, the processing recipe may be appropriately transmitted from another device through, e.g., a dedicated line. If necessary, any processing recipe may be retrieved in the storage unit in accordance with the instruction from the user interface and executed by the process controller, thereby performing a desired process in the film forming apparatus 100 under the control of the process controller.

Film Forming Method

The following is description of an embodiment of a film forming method performed by the film forming apparatus 100 configured as described above.

The film forming method of the present embodiment is applied to the case of forming a tungsten film on a wafer in which a barrier metal film is formed as a base film on a surface of a thermal oxide film or on a surface of an interlayer insulating film having a recess such as a trench, a hole, or the like.

Film Forming Method According to First Embodiment

First, a film forming method according to a first embodiment will be described.

In a state where the susceptor 2 is lowered to the transfer position, the gate valve 12 is opened and the wafer W is loaded into the chamber 1 through the loading/unloading port 11 by the transfer unit (not shown). The wafer W is mounted on the susceptor 2 heated to a predetermined temperature by the heater 21. Then, the susceptor 2 is raised to the processing position and the chamber 1 is evacuated to a predetermined vacuum level. Next, the opening/closing valves 76 and 78 are opened and the opening/closing valves 73, 74, 75, 77 and 79 are closed. $N_2$ gas is supplied into the chamber 1 from the first and the second $N_2$ gas supply source 54 and 55 through the first and the second continuous supply line 66 and 68. Thereafter, the pressure in the chamber 1 is increased and the temperature of the wafer W on the susceptor 2 is stabilized. After the pressure in the chamber 1 reaches a predetermined level, the tungsten film is formed by sequentially supplying gases as described below. As the wafer W, it is possible to use a wafer having a barrier metal film (e.g., a TiN film, a TiSiN film, a TiSi film, or a Ti film) as a base film on a surface of an interlayer insulating film having a recess, e.g., a trench, a hole, or the like. A tungsten film has a poor adhesive strength to the interlayer insulating film and has a long incubation time. Therefore, it is difficult to form a tungsten film on the interlayer insulating film.

However, the formation of the tungsten film can become easier by using, as a base film, a TiN film, a TiSiN film, a TiSi film or a Ti film. The base film is not limited thereto.

Figure 3:
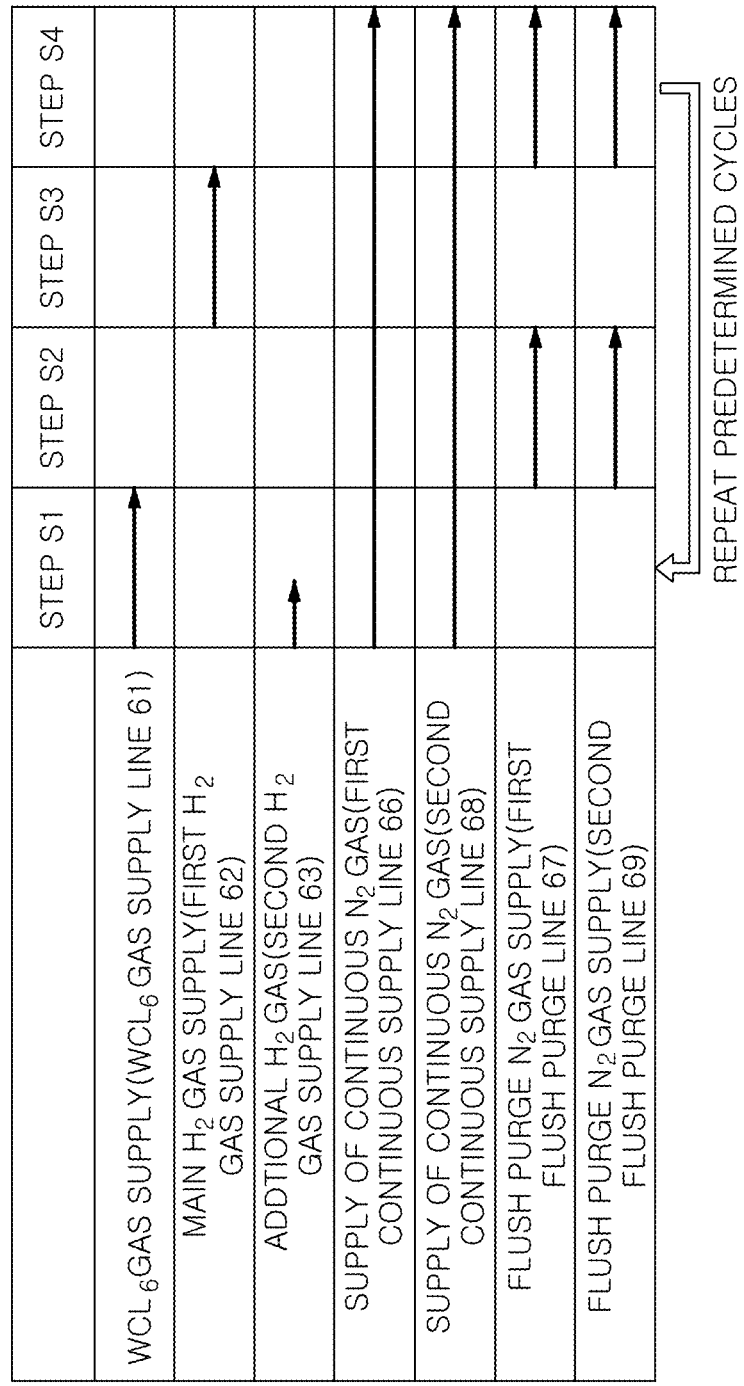
FIG. 3 shows a gas supply sequence of the film farming method according to the embodiment.

FIG. 3 shows a gas supply sequence of the film forming method according to the first embodiment.

First, in a state where the opening/closing valves 76 and 78 are opened, $N_2$ gas is continuously supplied from the first and the second $N_2$ gas supply source 54 and 55 through the first and the second continuous supply line 66 and 68. Further, by opening the opening/closing valves 73 and 75, $WCl_6$ gas is supplied from the $WCl_6$ gas supply source 51 into the chamber 1 through the $WCl_6$ gas supply line 61. At the same time, $H_2$ gas (additional $H_2$ gas) as an additional reduction gas is supplied into the processing space 37 of the chamber 1 through the second $H_2$ gas supply line 63 extended from the second $H_2$ gas supply source 53 (step S1). At this time, $WCl_6$ gas is supplied into the chamber 1 after it is once stored in the buffer tank 80.

By executing the step S1, $WCl_6$ is adsorbed onto the surface of the wafer W. However, at the same time, $WCl_6$ is activated by the added $H_2$.

Next, in a state where the supply of $N_2$ gas through the first and the second continuous supply line 66 and 68 is continued, the supply of $WCl_6$ gas and $H_2$ gas is stopped by closing the opening/closing valves 73 and 75. At the same time, $N_2$ gas (flush purge $N_2$ gas) is supplied through the first and the second flush purge line 67 and 69 by opening the opening/closing valves 77 and 79, so that a residual $WCl_6$ gas or the like in the processing space 37 is purged by a large flow rate of $N_2$ gas (step S2).

Next, the supply of $N_2$ gas through the first and the second flush purge line 67 and 69 is stopped by closing the opening/closing valves 77 and 79. In a state where the supply of $N_2$ gas through the first and the second first continuous supply line 66 and 68 is continued, $H_2$ gas (main $H_2$ gas) as the main reduction gas is supplied into the processing space 37 from the first $H_2$ gas supply source 52 through the first $H_2$ gas supply line 62 by opening the opening/closing valve 74 (step S3). At this time, $H_2$ gas is supplied into the chamber 1 after it is once stored in the buffer tank 81.

By executing the step S3, $WCl_6$ adsorbed onto the wafer W is reduced. The flow rate of the main $H_2$ gas at this time is enough to allow the reduction reaction to occur and is larger than that of the additional $H_2$ gas in the step S1.

Next, in a state where the supply of $N_2$ gas through the first and the second continuous supply line 66 and 68 is continued, the supply of $H_2$ gas through the first $H_2$ gas supply line 62 is stopped by closing the opening/closing valve 74. At the same time, $N_2$ gas (flush purge $N_2$ gas) is supplied from the first and the second flush purge line 67 and 69 by opening the opening/closing valves 77 and 79. As in the step S2, a residual $H_2$ gas in the processing space 37 is purged by a large flow rate of $N_2$ gas (step S4).

By executing one cycle of the steps S1 to S4 within a short period of time, a thin tungsten unit film is formed. By repeating such a cycle multiple times, a tungsten film of a desired film thickness is formed. The film thickness of the tungsten film can be controlled by the repetition number of the cycle.

In a conventional ALD method, only $WCl_6$ gas is supplied and adsorbed onto the wafer in the step S1. In that case, however, $WCl_6$ gas does not sufficiently contribute to the film formation. Thus, a deposited film thickness per one cycle is small and a film forming speed is low. On the other hand, in the present embodiment, when $WCl_6$ gas and a reduction gas are simultaneously supplied in the step S1, so that the supplied $WCl_6$ gas is activated and the film formation reaction in the step S3 is promoted. Accordingly, a deposited film thickness per one cycle can be increased and a film forming speed can be increased while maintaining a high step coverage.

At this time, if the flow rate of the additional $H_2$ gas supplied together with $WCl_6$ gas is excessive, the CVD reaction occurs in the step S1 and the step coverage is decreased. Therefore, in the step S1, the additional $H_2$ gas is supplied such that the ALD reaction mainly occurs. In other words, when $WCl_6$ gas is adsorbed, the flow rate of the additional $H_7$ gas needs to be restricted to a level at which the CVD reaction can be sufficiently suppressed. The flow rate of the $H_2$ gas at this time is preferably 100 sccm (mL/min) to 500 sccm (mL/min).

Figure 4A:
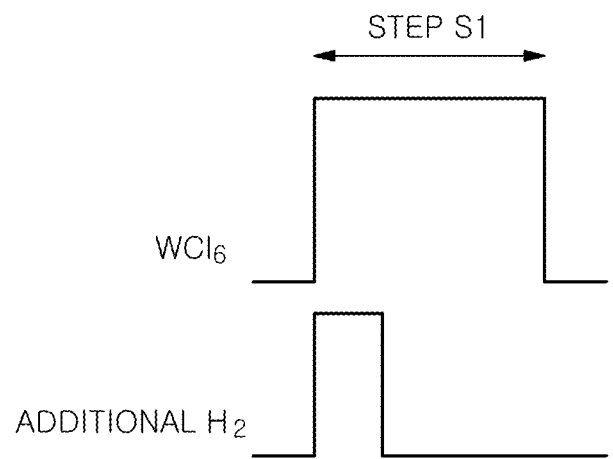
FIGS. 4A and 4B show examples of a $H_2$ gas supply period in a step S1 of the film forming method according to the embodiment.
Figure 4B:
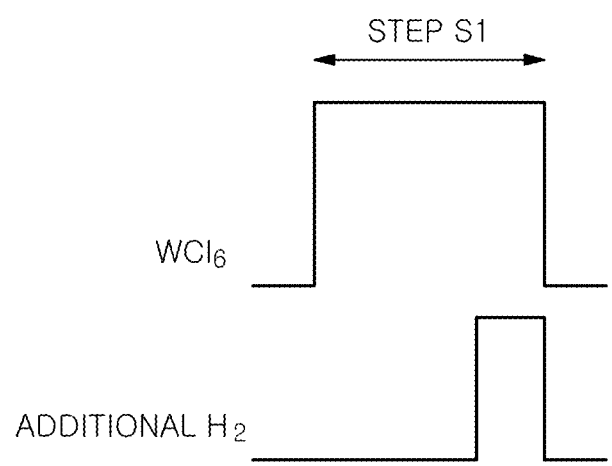

In the step S1, $H_2$ gas may be supplied during the entire $WCl_6$ gas supply period. However, in order suppress the CVD reaction, it is preferable to supply $H_2$ gas during a part of the $WCl_6$ gas supply period. Specifically, it is preferable to supply $H_2$ gas during about 1% to 30% of the entire $WCl_6$ gas supply period. Further, the $H_2$ gas may be supplied in an initial stage of the step S1 as shown in FIG. 4A or in a final stage of the step S1 as shown in FIG. 4B. Or, the $H_2$ gas may be supplied in an intermediate stage of the step S1. The addition timing may be appropriately adjusted depending on a device structure. $H_2$ has a smaller molecular weight than that of $WCl_6$. Therefore, if $H_2$ gas is introduced in the initial stage, it reaches the processing space 37 earlier than $WCl_6$ gas and the addition effect may not be sufficiently obtained. Accordingly, the addition effect can be enhanced when $H_2$ gas is added in the final stage.

In a state where $N_2$ gas as a purge gas is continuously supplied through the first and the second continuous supply line 66 and 68 to the $WCl_6$ gas supply line 61 and the first $H_2$ gas supply line 62 in the steps S1 to S4, $WCl_6$ gas and $H_2$ gas are intermittently supplied in the steps S1 and S3. Therefore, the gas replacement efficiency in the processing space 37 can be improved. Further, $N_2$ gas is added through the first and the second flush purge line 67 and 69 during the process of purging the processing space 37 in the steps S2 and S4. Thus, the gas replacement efficiency in the processing space 37 can be further improved. Accordingly, the controllability of the film thickness of the tungsten unit film can be improved. In the step S1, if $WCl_6$ gas and $H_2$ gas stay, the CVD reaction therebetween is promoted. However, the CVD reaction can be effectively suppressed by increasing the gas replacement efficiency in the purge process.

In the steps S1 to S4, $N_2$ gas as a purge gas flows through the first and the second continuous supply line 66 and 68, while $WCl_6$ gas and $H_2$ gas are intermittently supplied. The second $H_2$ gas supply line 63 for supplying the additional $H_2$ gas in the step S1 supplies $H_2$ gas to an upstream side of the gas flow compared to the first H2 gas supply line 62 for supplying the main $H_2$ gas in the step S1. Accordingly, the additional $H_2$ gas can be uniformly supplied. As a result, the uniform distribution of the in-plane film thickness of the tungsten film can be obtained.

In other words, the flow rate of the main $H_2$ gas is larger than that of the additional $H_2$ gas and the supply time in each step is extremely short. Therefore, if the main $H_2$ gas is supplied to the upstream side of the gas flow, the supply of the additional $H_2$ gas is disturbed by the main $H_2$ gas, which makes it difficult to uniformly supply the additional $H_2$ gas.

In the present embodiment, in order to form the tungsten film in a recess having a high aspect ratio while ensuring a high throughput and a high step coverage of about 100% by sequentially supplying gases, it is required to considerably increase a deposition speed per one cycle and decrease a period of time required for one cycle without deteriorating the step coverage. Accordingly, in the present embodiment, the $WCl_6$ gas supply line 61 and the first $H_2$ gas supply line 62 have the buffer tanks 80 and 81, respectively. As a result, $WCl_6$ gas and $H_2$ gas can be supplied within a short period of time. Even when one cycle is short, the required amount of $WCl_6$ gas and $H_2$ gas in the steps S1 and S3 can be supplied.

Film Forming Condition

In the case of using $WCl_6$ as a tungsten material, it may be difficult to form a tungsten film depending on a temperature condition and a pressure condition, because $WCl_6$ gas itself has an etching effect. Therefore, it is preferable to set the temperature condition and the pressure condition such that the etching reaction does not occur. In a low temperature area, the film forming reaction and the etching reaction do not occur. In order to allow the film forming reaction to occur, a high temperature at which the film forming reaction can occur is preferable. However, at the high temperature at which the film forming reaction occurs, the etching reaction tends to occur when a pressure is low. Therefore, the high temperature condition and the high pressure conditions are preferable.

Specifically, although the desirable conditions vary depending on the type of the base film, it is preferable to set the wafer temperature (susceptor surface temperature) to 300° C. or above and the pressure in the chamber to about 5 Torr (667 Pa) or above. As the temperature is increased, the amount of the formed film is increased. However, in view of equipment constraints and reactivity, the actual upper limit of the temperature is about 800° C. and more preferably about 300° C. to 600° C. Further, as the pressure is increased, the amount of the formed film is increased. However, the pressure also has the actual upper limit of about 100 Torr (13333 Pa) and more preferably about 10 Torr to 40 Torr (1333 Pa to 5332 Pa) in view of the equipment constraints and reactivity. The preferable ranges of the temperature condition and the pressure condition vary depending on the structure of the apparatus or other conditions.

Preferable ranges of other conditions are as follows.

$WCl_6$ gas flow rate: 3 sccm(mL/min) to 60 sccm (mL/min)

Carrier gas flow rate: 100 sccm (mL/min) to 2000 sccm (mL/min)

Main $H_2$ gas flow rate: 2000 sccm(mL/min) to 8000 sccm(mL/min)

Flow rate of additional $H_2$ gas (described above): 100 sccm (mL/min) to 500 sccm (mL/min)

Continuous supply $N_2$ gas flow rate: 100 sccm(mL/min) to 500 sccm(mL/min)

First and Second Continuous Supply Line 66 and 68 Flow rate of flush purge $N_2$ gas: 500 sccm (mL/min) to 3000 sccm (mL/min)

First and Second Flush Purge Line 67 and 69

Duration of step S1 (per once): 0.01 sec to 5 sec
Duration of step S3 (per once): 0.1 sec to 5 sec
Duration of steps S2 and S4 (purge (per once)): 0.1 sec to 5 sec
Additional $H_2$ gas supply period (per once) in step S1: 0.01 sec to 0.3 sec
Heating temperature of film forming material tank: 130° C. to 170° C.

The reduction gas is not limited to $H_2$ gas and may be any reducible gas containing hydrogen. For example, it is possible to use $SiH_4$ gas, $B_2H_6$ gas, $NH_3$ gas or the like instead of $H_2$ gas. Or, two or more gases among $H_2$ gas, $SiH_4$ gas, $B_2H_6$ gas, and $NH_3$ gas may be supplied. In addition, another reduction gas, e.g., $PH_3$ gas, $SiH_2Cl_2$ gas or the like, may be used. In order to obtain a low resistivity by further reducing impurities in the film, it is preferable to use $H_2$ gas. As tungsten chloride, $WCl_5$ may be used. $WCl_5$ exhibits substantially the same behavior as that of $WCl_6$. As the purge gas and the carrier gas, another inert gas such as Ar gas or the like may be used instead of $N_2$ gas.

Figure 5A:
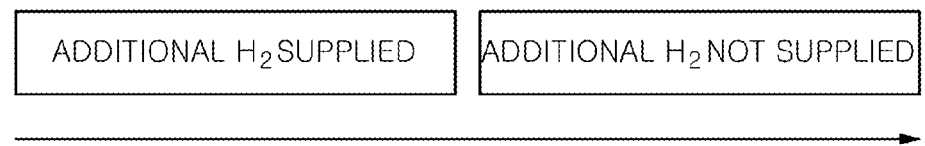
FIGS. 5A to 5C show examples in which an additional $H_2$ gas supply sequence is performed during a part of the entire processing period.
Figure 5B:
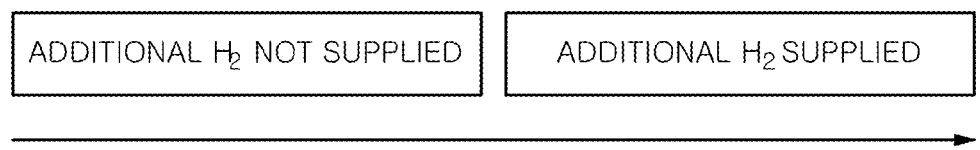
Figure 5C:
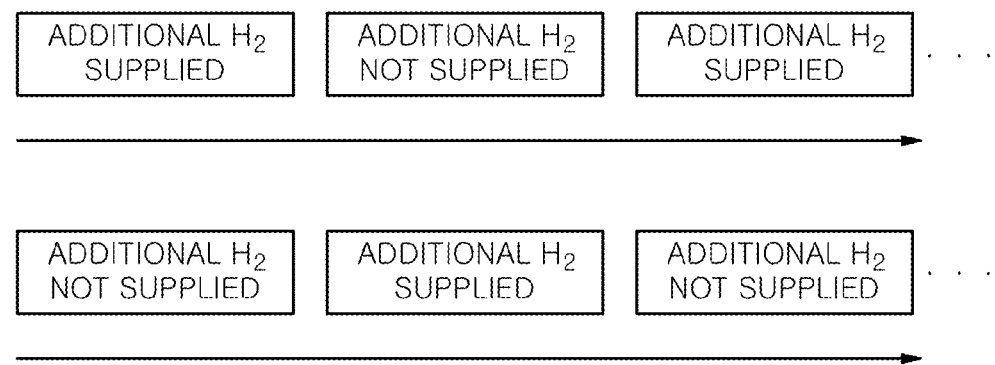

In the entire period of the film forming process, the sequence of supplying the additional $H_2$ gas may be performed during the $WCl_6$ gas supply period shown in FIG. 3. However, depending on a device structure to be applied, the sequence for supplying the additional $H_2$ gas is not necessarily performed during the entire period of the film forming process and may be performed during a part of the entire period. For example, it is possible to perform a sequence of supplying the additional $H_2$ gas, and then perform a sequence of not supplying the additional $H_2$ gas as shown in FIG. 5A. Or, it is also possible to perform the sequence of not supplying the additional $H_2$ gas and then perform the sequence of supplying the additional $H_2$ gas as shown in FIG. 5B. Or, those sequences may be repeated as shown in FIG. 5C.

Figure 6A:
FIGS. 6A and 6B explain the case of applying to two-step film formation an example in which an additional $H_2$ gas is not supplied in a first step but supplied in a second step.
Figure 6B:
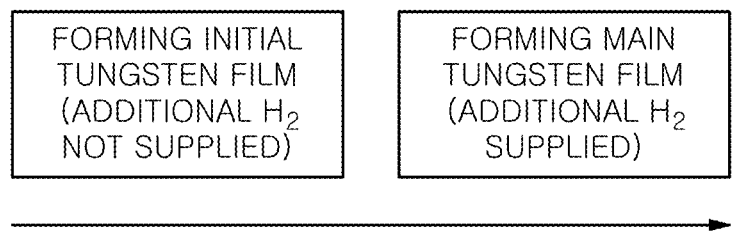

Example of FIG. 5B is shown in FIGS. 6A and 6B. The two-step film formation is performed by forming an initial tungsten film 203 by supplying $WCl_6$ gas at a small flow rate in an initial stage on a barrier film 202 such as a TiN film or the like formed on a base film ($SiO_2$ film or Si substrate) 201 and then forming a main tungsten film 204 by supplying $WCl_6$ gas at a large flow rate, as shown in FIG. 6A. Here, the initial tungsten film 203 may be formed under the condition that the additional $H_2$ gas is not supplied and the main tungsten film 204 may be formed under the condition that the additional $H_2$ gas is supplied, as shown in FIG. 6B.

In other words, since $WCl_6$ gas etches the TiN film or the like forming a base barrier film, there is required a process of forming an initial tungsten film 203 by supplying $WCl_6$ gas at a small flow rate to suppress etching and then forming a main tungsten film 204 by supplying $WCl_6$ gas at a large flow rate. In this process, the initial tungsten film 203 has a poor step coverage due to a small flow rate of $WCl_6$ gas. Further, when the initial tungsten film 203 is formed under the condition that the additional $H_2$ gas is supplied, the reaction of $WCl_6$ gas on the surface is facilitated and the step coverage becomes poorer, Therefore, the initial tungsten film 203 is formed under the condition that the additional $H_2$ gas is not supplied and the main tungsten film 204 is formed under the condition that the additional $H_2$ gas is supplied to increase the flow rate of $WCl_6$ gas. In this manner, the productivity is increased.

By executing the sequence using the additional $H_2$ gas, the throughput can be increased while maintaining a high step coverage. Since, however, the CVD reaction occurs, the step coverage may be slightly decreased compared to the case in which the additional $H_2$ gas is not supplied. In that case, it is effective to execute the sequence of supplying the additional $H_2$ gas during the period in which a. high throughput is required and execute the sequence of not supplying the additional $H_2$ gas during the period in which a high step coverage is required.

Film Forming Method According to Second Embodiment

Hereinafter, a film forming method according to a second embodiment will be described.

In the second embodiment, as in the first embodiment, first, in a state where the susceptor 2 is lowered to a transfer position, the gate valve 25 is opened. Then, the wafer W is loaded into the chamber 1 through the loading/unloading port 11 by a transfer unit (not shown) and mounted on the susceptor 2 heated to a predetermined temperature by the heater 21. Next, the susceptor 2 is raised to the processing position and the pressure in the chamber 1 is decreased to a predetermined vacuum level. Thereafter, $N_2$ gas is supplied into the chamber 1 from the first $N_2$ gas supply source 54 and the second $N_2$ gas supply source 55 through the first continuous supply line 66 and the second continuous supply line 68 by opening the opening/closing valves 76 and 78 and closing the opening/closing valves 73, 74, 75, 77 and 79. The pressure in the chamber 1 is increased and a temperature of the wafer W on the susceptor 2 is stabilized. After the pressure in the chamber 1 reaches a predetermined level, a tungsten film is formed by sequentially supplying gases as described below. In the second embodiment, the same wafer W as that in the first embodiment may be used.

Figure 7:
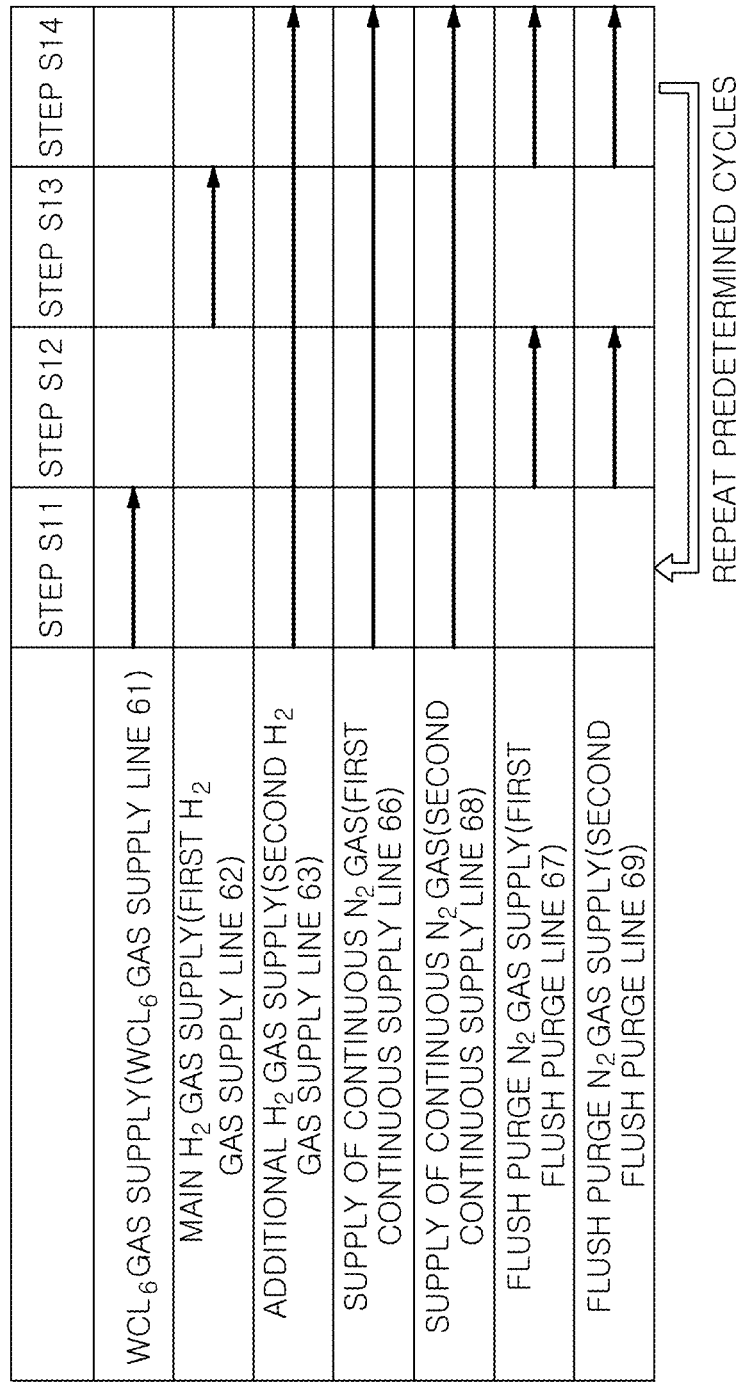
FIG. 7 shows a gas supply sequence of a film forming method according to a second embodiment.

FIG. 7 shows a gas supply sequence of a film forming method according to the second embodiment.

First, in a state where the opening/closing valves 76 and 78 are opened, $N_2$ gas is continuously supplied from the first and the second $N_2$ gas supply source 54 and 55 through the first and the second continuous supply line 66 and 68. Further, by opening the opening/closing valves 73 and 75, $WCl_6$ gas is supplied from the $WCl_6$ gas supply source 51 into the processing space 37 of the chamber 1 through the $WCl_6$ gas supply line 61. At the same time, $H_2$ gas (additional $H_2$ gas) as an additional reduction gas is supplied into the chamber 1 through the second $H_2$ gas supply line 63 extended from the second $H_2$ gas supply source 53 (step S11). At this time, $WCl_6$ gas is supplied into the chamber 1 after it is once stored in the buffer tank 80.

By executing the step S11, $WCl_6$ is adsorbed onto the surface of the wafer W. However, at the same time, $WCl_6$ is activated by the added $H_2$.

Next, in a state where the supply of $N_2$ gas through the first and the second continuous supply line 66 and 68 and the supply of the additional $H_2$ gas through the second $H_2$ gas supply line 63 are continued, the supply of $WCl_6$ gas is stopped by closing the opening/closing valve 73. At the same time, $N_2$ gas (flush purge $N_2$ gas) is supplied through the first and the second flush purge line 67 and 69 by opening the opening/closing valves 77 and 79. A residual $WCl_6$ gas or the like in the processing space 37 is purged by a large flow rate of $N_2$ gas (step S12).

Next, the supply of $N_2$ gas through the first and the second flush purge line 67 and 69 is stopped by closing the opening/closing valves 77 and 79. In a state where the supply of $N_2$ gas through the first and the second first continuous supply line 66 and 68 and the supply of the additional $H_2$ gas through the second $H_2$ gas supply line 63 are continued, $H_2$ gas (main $H_2$ gas) as a main reduction gas is supplied into the processing space 37 from the first $H_2$ gas supply source 52 through the first $H_2$ gas supply line 62 by opening the opening/closing valve 74 (step S13). At this time, the main $H_2$ gas is supplied into the chamber 1 after it is once stored in the buffer tank 81.

By executing the step S13, $WCl_6$ adsorbed onto the wafer W is reduced. The flow rate of the main $H_2$ gas at this time is enough to allow the reduction reaction to occur and is larger than that of the additional $H_2$ gas.

Next, in a state where the supply of $N_2$ gas through the first and the second continuous supply line 66 and 68 and the supply of the additional $H_2$ gas through the second $H_2$ gas supply line 63 are continued, the supply of $H_2$ gas through the first $H_2$ gas supply line 62 is stopped by closing the opening/closing valve 74. At the same time, $N_2$ gas (flush purge $N_2$ gas) is supplied from the first and the second flush purge line 67 and 69 by opening the opening/closing valves 77 and 79, so that, as in the step S12, a residual $H_2$ gas in the processing space 37 is purged by a large flow rate of $N_2$ gas (step S14).

By executing one cycle of the steps S11 to S14 within a short period of time, a thin tungsten unit film is formed. By repeating such a cycle multiple times, a tungsten film of a desired film thickness is formed. The film thickness of the tungsten film can be controlled by the repetition number of the cycle. In the second embodiment, the film forming rate is slightly lower than that in the first embodiment. However, the second embodiment is advantageous in that the manipulation of the valve is decreased.

In the present embodiment, the additional $H_2$ gas is continuously supplied during the steps S11 to S14. Therefore, $WCl_6$ gas supplied in the step S11 is activated by supplying the additional $H_2$ gas as an additional reduction gas and the film forming reaction in the step S13 is promoted. As a result, as in the first embodiment, a deposited film thickness per one cycle can be increased and a film forming speed can be increased while maintaining a high step coverage.

In the present embodiment, the additional $H_2$ gas is continuously supplied, so that the CVD reaction is promoted. Therefore, in order to suppress the CVD reaction, it is preferable to decrease a flow rate of the additional $H_2$ gas to, e.g., about 10 sccm (mL/min) to 500 sccm (mL/min).

Other film forming conditions are the same as those of the first embodiment. As in the first embodiment, the reduction gas is not limited to $H_2$ gas and may be any reducing gas containing hydrogen. For example, $SiH_4$ gas, $B_2H_6$ gas, $NH_3$ gas or the like may be used other than $H_2$ gas. Or, two or more gases among $H_2$ gas, $SiH_4$ gas, $B_2H_6$ gas, and $NH_3$ gas may be supplied. Another reduction gas, e.g., $PH_3$ gas or $SiH_2Cl_2$ gas, may also be used. As tungsten chloride, $WCl_5$ may be used. As the purge gas and the carrier gas, another inert gas such as Ar gas or the like may be used instead of $N_2$ gas.

In the present embodiment, the sequence of supplying the additional $H_2$ gas is not necessarily performed during the entire period of the film forming process. Depending on a device structure to be applied, the sequence of supplying the additional $H_2$ gas may be performed during a part of the entire period.

Test Examples

Hereinafter, test examples will be described.

Test Example 1

Here, a TiN film as a base film was formed on a wafer having a hole having an upper diameter of 0.1 μm and an aspect ratio of 80, and a tungsten film was formed by the film forming apparatus shown in FIG. 1 by using the sequence of the first embodiment. At this time, the following conditions were applied.

Wafer temperature: 550° C.
Pressure in chamber: 30 Torr (4000 Pa)
Heating temperature of film forming material tank: 170° C.
Carrier $N_2$ gas flow rate: 800 sccm
($WCl_6$ gas flow rate: 20 sccm)
Continuous $N_2$ gas flow rate: 1200 sccm
Flush $N_2$ gas flow rate: 1500 sccm
Main $H_2$ gas flow rate: 5000 sccm
Additional $H_2$ gas flow rate: 250 sccm, 500 sccm, 1000 sccm.
Duration of step S1 (per once): 0.3 sec
Duration of step S2 (per once): 0.2 sec
Duration of step S3 (per once): 0.3 sec Duration of step S4 (per once): 0.2 sec
Number of cycles: 600 times The additional $H_2$ gas was supplied in an initial stage of the step S1 for 0.03 sec.

Figure 8:
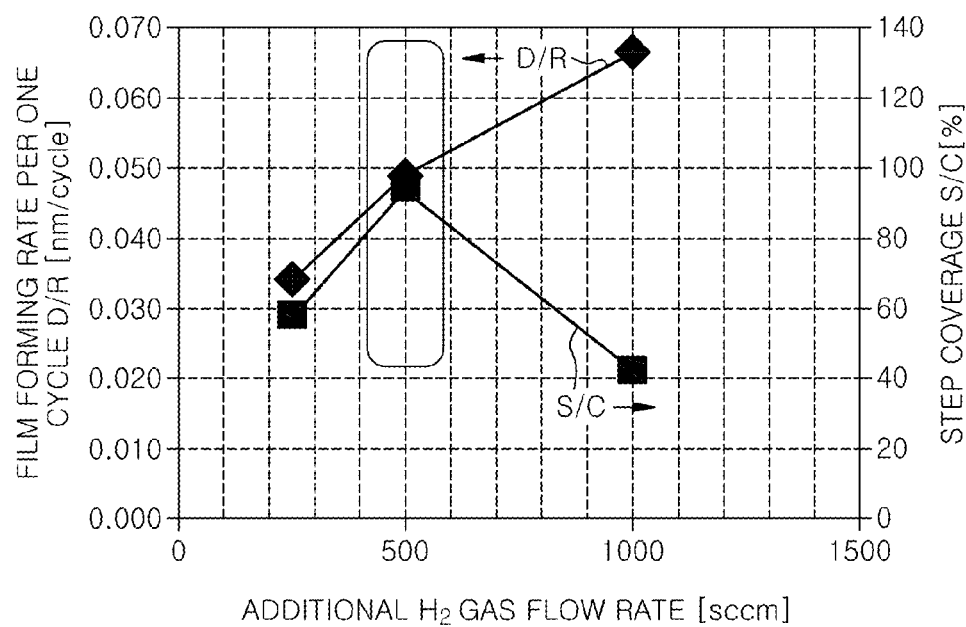
FIG. 8 shows relation between an additional $H_2$ gas flow rate and a film forming rate per one cycle and relation between an additional $H_2$ gas flow rate and a step coverage in a test example 1.

FIG. 8 shows relation between the additional $H_2$ gas flow rate and the film forming rate per one cycle and relation between the additional $H_2$ gas flow rate and the step coverage (bottom film thickness/top film thickness). As shown in FIG. 8, when the additional $H_2$ gas flow rate was 250 sccm to 1000 sccm, a high film forming rate of 0.03 nm/cycle or above was obtained and a high step coverage was obtained. Especially, when the additional $H_2$ gas flow rate was 500 sccm, the film forming rate was 0.05 nm/cycle and the step coverage was substantially 100%. From the above, it was found that the film forming method of the first embodiment can provide both of a high film forming rate and a high step coverage. When the additional $H_2$ gas flow rate was 250 sccm, the film thickness was 20.2 nm. When the additional $H_2$ gas flow rate was 500 sccm, the film thickness was 27.6 nm. When the additional $H_2$ gas flow rate was 1000 sccm, the film thickness was 38.5 nm. When the additional $H_2$ gas flow rate was 250 sccm, the resistivity was 14.8 $\Omega/\sqrt[3]{}$. When the additional $H_2$ gas flow rate was 500 sccm, the resistivity was 9.6 $\Omega/\sqrt[3]{}$. When the additional $H_2$ gas flow rate was 1000 sccm, the resistivity was 5.9 $\neq/\sqrt[3]{}$. These resistivities were useful.

On the other hand, the film formation was performed by the ALD method without using the additional $H_2$ gas. At this time, the following conditions were applied.

Wafer temperature: 550° C.
Pressure in chamber: 30 Torr (4000 Pa)
Heating temperature of film forming material tank: 170° C.
Carrier $N_2$ gas flow rate: 800 sccm
($WCl_6$ gas flow rate: 20 sccm)
Continuous $N_2$ gas flow rate: 1200 sccm
Flush $H_2$ gas flow rate: 1500 sccm
Main $H_2$ gas flow rate: 5000 sccm
Additional $H_2$ gas flow rate: 250 sccm, 500 sccm, 1000 sccm
Duration of step S1 (per once): 0.3 sec
Duration of step S2 (per once): 0.2 sec
Duration of step S3 (per once): 0.3 sec
Duration of step S4 (per once): 0.2 sec
Number of cycles: 1200 times As a result, although the step coverage of substantially 100% was obtained, the film forming rate was decreased to 0.133 nm/cycle. Further, the number of cycles was increased to 1200 times and the film thickness was decreased to 16.0 nm.

Figure 9:
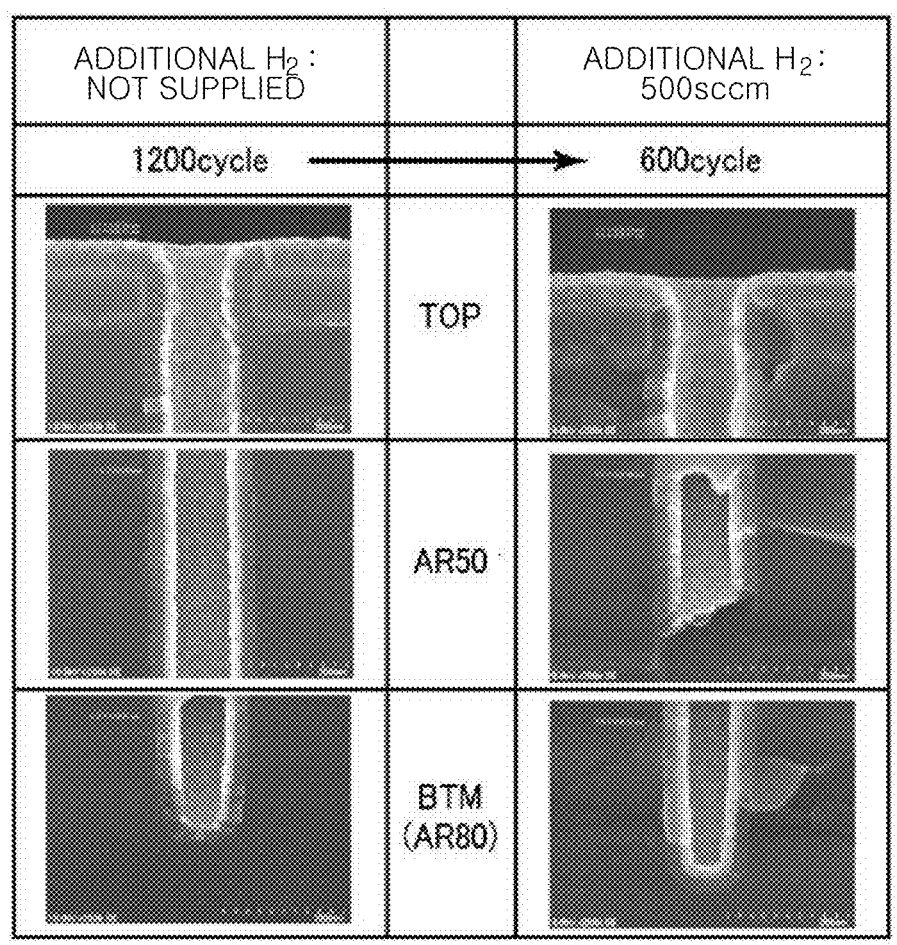
FIG. 9 shows SEM images of cross sections obtained when a tungsten film is formed by a conventional technique without supplying an additional $H_2$ gas and when a tungsten film is formed with supplying an additional $H_2$ gas at a flow rate of 500 sccm in the test example 1.

FIG. 9 shows SEM images of cross sections obtained in the case of forming a tungsten film by a conventional technique without using an additional $H_2$ gas and in the case of forming a tungsten film by using an additional $H_2$ gas at a flow rate of 500 sccm. The SEM images show that when $WCl_6$ gas and $H_2$ gas are simultaneously supplied, it is possible to form a tungsten film having substantially the same thickness as that in the conventional case by executing the cycle only a half number of times compared to that in the conventional case while maintaining the same step coverage as that in the conventional case.

Test Example 2

As in the test example 1, a TiN film as a base film was formed on a wafer having a hole having an upper diameter of 0.1 μm and an aspect ratio of 80, and a tungsten film was formed by the film forming apparatus shown in FIG. 1 by using the sequence of the second embodiment. At this time, the following conditions were applied.

Figure 10:
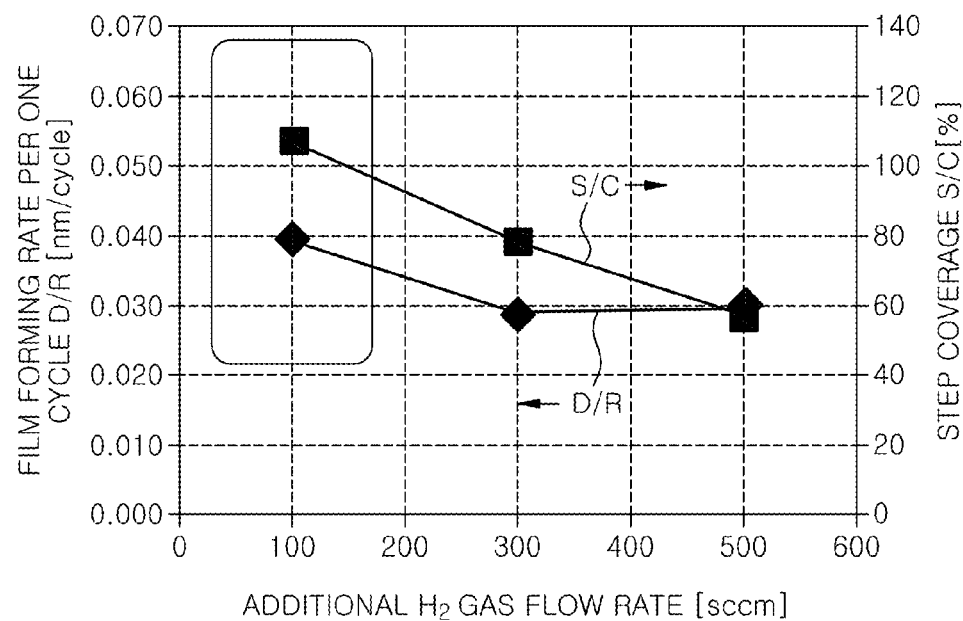
FIG. 10 shows relation between an additional $H_2$ gas flow rate and a film forming rate per one cycle and relation between an additional $H_2$ gas flow rate and a step coverage in a test example 2.

Wafer temperature: 550° C.
Pressure in chamber: 30 Torr (4000 Pa)
Heating temperature of film forming material tank: 170° C.
Carrier $N_2$ gas flow rate: 800 sccm
($WCl_6$ gas flow rate: 20 sccm)
Continuous $N_2$ gas flow rate: 1200 sccm
Flush $N_2$ gas flow rate: 1500 sccm
Main $H_2$ gas flow rate: 5000 sccm
Additional $H_2$ gas flow rate (constant supply): 100 sccm, 300 sccm, 500 sccm
Duration of step S1 (per once): 0.3 sec
Duration of step S2 (per once): 0.2 sec
Duration of step S3 (per once): 0.3 sec
Duration of step S4 (per once): 0.2 sec
Number of cycles: 600 times FIG. 10 shows relation between the additional $H_2$ gas flow rate and the film forming rate per one cycle and relation between the additional $H_2$ gas flow rate and the step coverage (bottom film thickness/top film thickness). As shown in FIG. 10, when the additional $H_2$ gas flow rate was 100 sccm to 500 sccm, a high film forming rate of 0.03 nm/cycle or above was obtained and a high step coverage was obtained. Especially, when the additional $H_2$ gas flow rate was 100 sccm, the film forming rate was 0.04 nm/cycle and the step coverage was substantially 100%. From the above, it was found that the film forming method of the second embodiment can provide both of a high film forming rate and a high step coverage. When the additional $H_2$ gas flow rate was 100 sccm, the film thickness was 23.5 nm. When the additional $H_2$ gas flow rate was 300 sccm, the film thickness was 17.0 nm. When the additional $H_2$ gas flow rate was 500 sccm, the film thickness was 17.4 nm. When the additional $H_2$ gas flow rate was 100 sccm, the resistivity was 14.3 $\Omega/\sqrt[3]{}$. When the additional $H_2$ gas flow rate was 300 sccm, the resistivity was 19.2 $\neq/\sqrt[3]{}$. When the additional $H_2$ gas flow rate was 500 sccm, the resistivity was 18.5 $\Omega/\sqrt[3]{}$. These resistivities were useful.

Test Example 3

When the two-step film formation is performed by forming an initial tungsten film on the TiN film using the ALD method with supplying a small amount of $WCl_6$ gas and then forming a main tungsten film using the ALD method with supplying a large amount of $WCl_6$ gas, the initial tungsten film was formed under the condition that the additional $H_2$ gas is not supplied and the main tungsten film was formed under the condition that the additional $H_2$ gas is supplied.

At this time, the following conditions were applied.
Initial tungsten film formation
Wafer temperature: 500° C.
Pressure in chamber: 45 Torr (6000 Pa)
Carrier $N_2$ gas flow rate: 300 sccm
($WCl_6$ gas flow rate: 6 sccm)
Continuous $N_2$ gas flow rate: 4000 sccm
Flush $N_2$ gas flow rate: 0 sccm
Main $H_2$ gas flow rate: 5000 sccm
Additional $H_2$ gas flow rate: 0 sccm
Main tungsten film formation
Wafer temperature: 500° C.
Pressure in chamber: 30 Torr (4000 Pa)
Carrier $N_2$ gas flow rate: 600 sccm
($WCl_6$ gas flow rate: 20 sccm)

Continuous N₂ gas flow rate: 1200 sccm
Flush N₂ gas flow rate: 1500 sccm+1500 sccm
Main H₂ gas flow rate: 5000 sccm
Additional H₂ gas flow rate: 200 sccm Under the same ALD conditions as those of the test example 1, the initial tungsten film and the main tungsten film were formed. In the case of forming the initial tungsten film, the number of cycles was fixed to 100 times. In the case of forming the main tungsten film, the number of cycles was varied to 400 times (sample 1), 1200 times (sample 2), and 3300 times (sample 3).

As a result, in the sample 1, the step coverages at the center and the edge were 85% and 100%, respectively. In the sample 2, the step coverages at the center and the edge were 100% and 90%, respectively. In the sample 3, the step coverages at the center and the edge were 90% and 100%, respectively. In other words, the step coverage is not affected by the etching of the TiN film as a base film.

Other Application

While the embodiments have been described, the present invention may be variously modified without being limited to the above-described embodiments. For example, in the above-described embodiments, the semiconductor wafer was described as an example of the target substrate. However, the semiconductor wafer may be a silicon substrate or a compound semiconductor such as GaAs, SiC, GaN or the like. Further, the present disclosure may be applied to a glass substrate used for a FPD (Flat Panel Display) such as a liquid crystal display or the like, a ceramic substrate, or the like, without being limited to the semiconductor wafer.

While the disclosure has been shown and described with respect to the embodiments, it will be understood by those skilled in the art that various changes and modifications may be made without departing from the scope of the disclosure as defined in the following claims.

What is claimed is:

1. A tungsten film forming method for forming a tungsten film on a surface of a target substrate by an ALD (atomic layer deposition) method in which a tungsten chloride gas as a tungsten source gas and a reduction gas for reducing the tungsten chloride gas are alternately supplied into a chamber which accommodates the target substrate and is maintained under a depressurized atmosphere, with a purge process for purging an inside of the chamber performed between the supply of the tungsten chloride gas and the supply of the reduction gas, the method comprising:
adding the reduction gas to allow an ALD reaction to mainly occur when the tungsten chloride gas is supplied.

2. The tungsten film forming method of claim 1, wherein a cycle for forming a tungsten unit film is repeated multiple times, the cycle including a first step of supplying the tungsten chloride gas into the chamber, a second step of purging the chamber, a third step of supplying the reduction gas into the chamber and reducing tungsten chloride, and a fourth step of purging the chamber, and
wherein the reduction gas is added in the first step.

3. The tungsten film forming method of claim 2, wherein the reduction gas is added in the first step at a flow rate of about 100 sccm to 500 sccm.

4. The tungsten film forming method of claim 2, wherein the reduction gas is added in the first step during a part of a period in which the tungsten chloride gas is supplied.

5. The tungsten film forming method of claim 2, wherein the tungsten chloride gas and the reduction gas are supplied into the chamber by continuously supplying a purge gas into the chamber from the first step to the fourth step and a flow rate of the purge gas is increased in the second step and the fourth step.

6. The tungsten film forming method of claim 5, wherein an additional purge gas is supplied in the second step and the fourth step through a gas line different from a gas line for continuously supplying the purge gas.

7. The tungsten film forming method of claim 2, wherein the tungsten chloride gas and the reduction gas are supplied via buffer tanks provided in a gas line for supplying the tungsten chloride gas and a gas line for supplying the reduction gas in the third step, respectively.

8. The tungsten film forming method of claim 1, wherein a cycle for forming a tungsten unit film is repeated multiple times, the cycle including a first step of supplying the tungsten chloride gas into the chamber, a second step of purging the chamber, a third step of supplying the reduction gas into the chamber and reducing tungsten chloride, and a fourth step of purging the chamber, and
wherein the reduction gas is continuously added from the first step to the fourth step.

9. The tungsten film forming method of claim 8, wherein the reduction gas is continuously added from the first step to the fourth step at a flow rate of about 10 sccm to 500 sccm.

10. The tungsten film forming method of claim 1, wherein a reduction gas added when the tungsten chloride gas is supplied and a reduction gas for reducing the tungsten chloride gas are supplied into the chamber through separate gas lines, and an additional reduction gas line for supplying the added reduction gas is provided at an upstream side of gas flow toward the chamber compared to a main reduction gas line for supplying the reduction gas for reduction.

11. The tungsten film forming method of claim 1, wherein during the tungsten film formation, a temperature of the target substrate is about 300° C. or above and a pressure in the chamber is about 5 Torr or above.

12. The tungsten film forming method of claim 1, wherein the tungsten chloride is $WCl_6$.

13. The tungsten film forming method of claim 1, wherein the reduction gas is one or more gases selected among $H_2$ gas, $SiH_4$ gas, $B_2H_6$ gas, and $NH_3$ gas.

14. The tungsten film forming method of claim 1, wherein the target substrate has, as a base of the tungsten film, one or more films selected among a TiN film, a TiSiN film, a TiSi film and a Ti film, formed thereon.

15. A tungsten film forming method comprising:
a first period of forming a film by the film forming method described in claim 1, in which the reduction gas is added; and
a second period of forming a film by an ALD method in which the reduction gas is not added when the tungsten chloride gas is supplied.

16. The tungsten film forming method of claim 15, wherein a base film is formed on the surface of the target substrate,
wherein the tungsten film is formed by two-step film formation in which an initial tungsten film is formed by supplying the tungsten chloride gas at a small flow rate and a main tungsten film is formed by supplying the tungsten chloride gas at a large flow rate, and
wherein the initial tungsten film is formed during the second period and the main tungsten film is formed during the first period.

17. The tungsten film forming method of claim 15, wherein the first period and the second period are repeated.

18. A computer-executable storage medium storing a program for controlling a film forming apparatus, wherein the program, when executed, causes a computer to control the film forming apparatus to perform the tungsten film forming method described in claim 1.

* * * * *